(12) United States Patent
Li et al.

(10) Patent No.: US 7,321,254 B2
(45) Date of Patent: Jan. 22, 2008

(54) ON-CHIP AUTOMATIC PROCESS VARIATION, SUPPLY VOLTAGE VARIATION, AND TEMPERATURE DEVIATION (PVT) COMPENSATION METHOD

(75) Inventors: Weidan Li, San Jose, CA (US); Benjamin Mbouombouo, San Jose, CA (US); Johann Leyrer, Munich (DE)

(73) Assignee: LSI Logic Corporation, Milpitas, CA (US)

(*) Notice: Subject to any disclaimer, the term of this patent is extended or adjusted under 35 U.S.C. 154(b) by 69 days.

(21) Appl. No.: 11/004,415

(22) Filed: Dec. 3, 2004

(65) Prior Publication Data

US 2006/0119420 A1 Jun. 8, 2006

(51) Int. Cl.
*H03K 3/01* (2006.01)
(52) U.S. Cl. .................... 327/534; 327/513
(58) Field of Classification Search ........... 327/158, 327/512, 513, 534, 535, 537
See application file for complete search history.

(56) References Cited

U.S. PATENT DOCUMENTS

| | | | | |
|---|---|---|---|---|
| 5,155,380 A | * | 10/1992 | Hwang et al. | 327/99 |
| 5,208,557 A | * | 5/1993 | Kersh, III | 331/57 |
| 5,999,009 A | * | 12/1999 | Mitsui | 324/765 |
| 6,020,781 A | * | 2/2000 | Fujioka | 327/541 |
| 6,097,113 A | * | 8/2000 | Teraoka et al. | 307/125 |
| 6,100,768 A | * | 8/2000 | Hirayama | 331/57 |
| 6,166,577 A | * | 12/2000 | Mizuno et al. | 327/278 |
| 6,310,928 B1 | * | 10/2001 | Yunome | 375/376 |
| 6,466,077 B1 | * | 10/2002 | Miyazaki et al. | 327/534 |
| 6,535,013 B2 | * | 3/2003 | Samaan | 324/765 |
| 6,560,164 B2 | * | 5/2003 | Kawai et al. | 365/233 |
| 2002/0017946 A1 | * | 2/2002 | Fujii et al. | 327/534 |
| 2004/0012449 A1 | * | 1/2004 | Illegems | 331/57 |
| 2005/0218871 A1 | * | 10/2005 | Kang et al. | 323/265 |
| 2006/0132243 A1 | * | 6/2006 | Yamanaka et al. | 331/2 |

* cited by examiner

*Primary Examiner*—Kenneth B. Wells
*Assistant Examiner*—Thomas J. Hiltunen
(74) *Attorney, Agent, or Firm*—Trexler, Bushnell, Giangiorgi & Blackstone Ltd.

(57) ABSTRACT

An on-chip substrate voltage controller which includes a plurality of chains of interconnected loaded ring oscillators connected to a multiplexer, where the multiplexer is configured to average the outputs from all the chains of interconnected loaded ring oscillators. An output of the multiplexer is connected to a comparator, such as a phase detector. The comparator also receives an output from a PLL, and is configured to compare the output of the multiplexer to the output of the PLL. An output of the comparator is connected to the controllable voltage regulator. The controllable voltage regulator receives a voltage in as well as the output of the comparator, and applies a substrate bias depending on what is received from the comparator.

4 Claims, 2 Drawing Sheets

ON-CHIP AUTOMATIC PROCESS VARIATION, SUPPLY VOLTAGE VARIATION, AND TEMPERATURE DEVIATION (PVT) COMPENSATION METHOD

BACKGROUND

As the industry has advanced, process variation in deep sub-micron chip manufacturing has become more and more significant. Process variation can cause more than a 30% variation in circuit performance, and cause even a larger power consumption variation. Presently, how process variation causes performance variation and power consumption variation is one of the most important problems in deep sub-micron chip making.

A large amount of time margins are usually added to the design flow to compensate for the delay fluctuation which is caused by process variation. However, this compensation method (i.e., adding time margins) can only ensure that the circuit will function. It does not compensate for power consumption variation. As such, process variation impacts performance and power consumption and typically performance and power consumption are not optimized.

OBJECTS AND SUMMARY

An object of an embodiment of the present invention is to provide an on-chip substrate voltage controller which compensates for process variation.

Another object of an embodiment of the present invention is to provide an on-chip substrate voltage controller which measures the impact of process variation supply voltage variation and temperature deviation on circuit performance and applies an appropriate substrate bias to adjust chip performance and power consumption.

Briefly, and in accordance with at least one of the foregoing objects, an embodiment of the present invention is to provide an on-chip substrate voltage controller which includes a plurality of chains of interconnected loaded ring oscillators connected to a multiplexer, where the multiplexer is configured to average the outputs from all the chains of interconnected loaded ring oscillators. An output of the multiplexer is connected to a comparator, such as a phase detector. The comparator also receives an output from a PLL, and is configured to compare the output of the multiplexer to the output of the PLL. An output of the comparator is connected to the controllable voltage regulator. The controllable voltage regulator receives a voltage in as well as the output of the comparator, and applies a substrate bias depending on what is received from the comparator.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
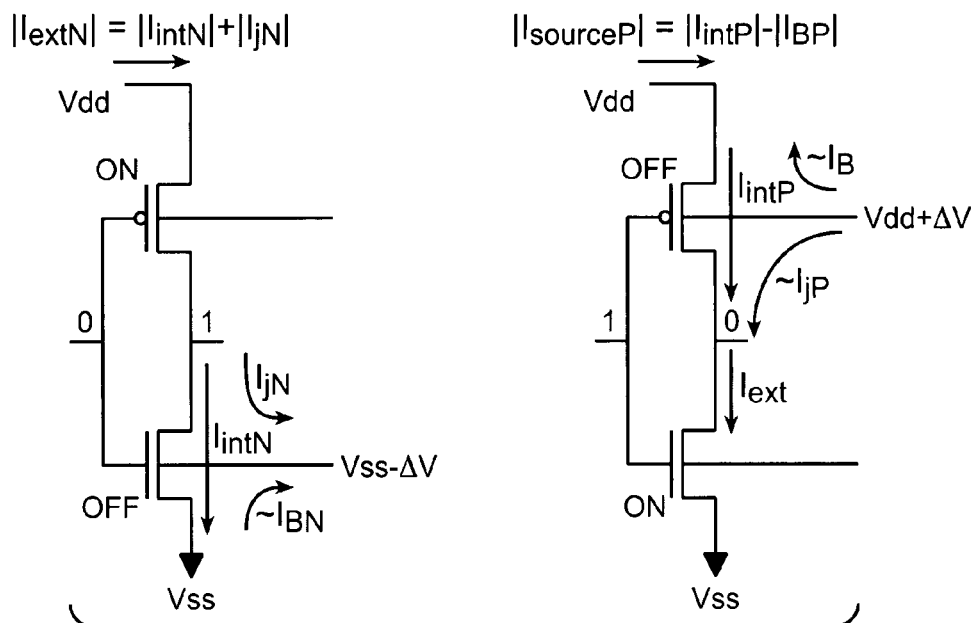
FIG. 1 provides a pair of circuits which illustrate how to apply substrate bias ($\Delta V$) on NMOS and PMOS transistors, and how it impacts leakage current.

While the invention may be susceptible to embodiment in different forms, there is shown in the drawings, and herein will be described in detail, a specific embodiment of the invention. The present disclosure is to be considered an example of the principles of the invention, and is not intended to limit the invention to that which is illustrated and described herein.

An embodiment of the present invention provides an on-chip substrate voltage controller which measures the impact of process variation supply voltage variation and temperature deviation on circuit performance and applies an appropriate substrate bias to adjust chip performance and power consumption.

MOS transistor performance and power consumption are a function of substrate bias. FIG. 1 illustrates how to apply substrate bias ($\Delta V$) on NMOS and PMOS transistors, and how it impacts leakage current.

Figure 2:
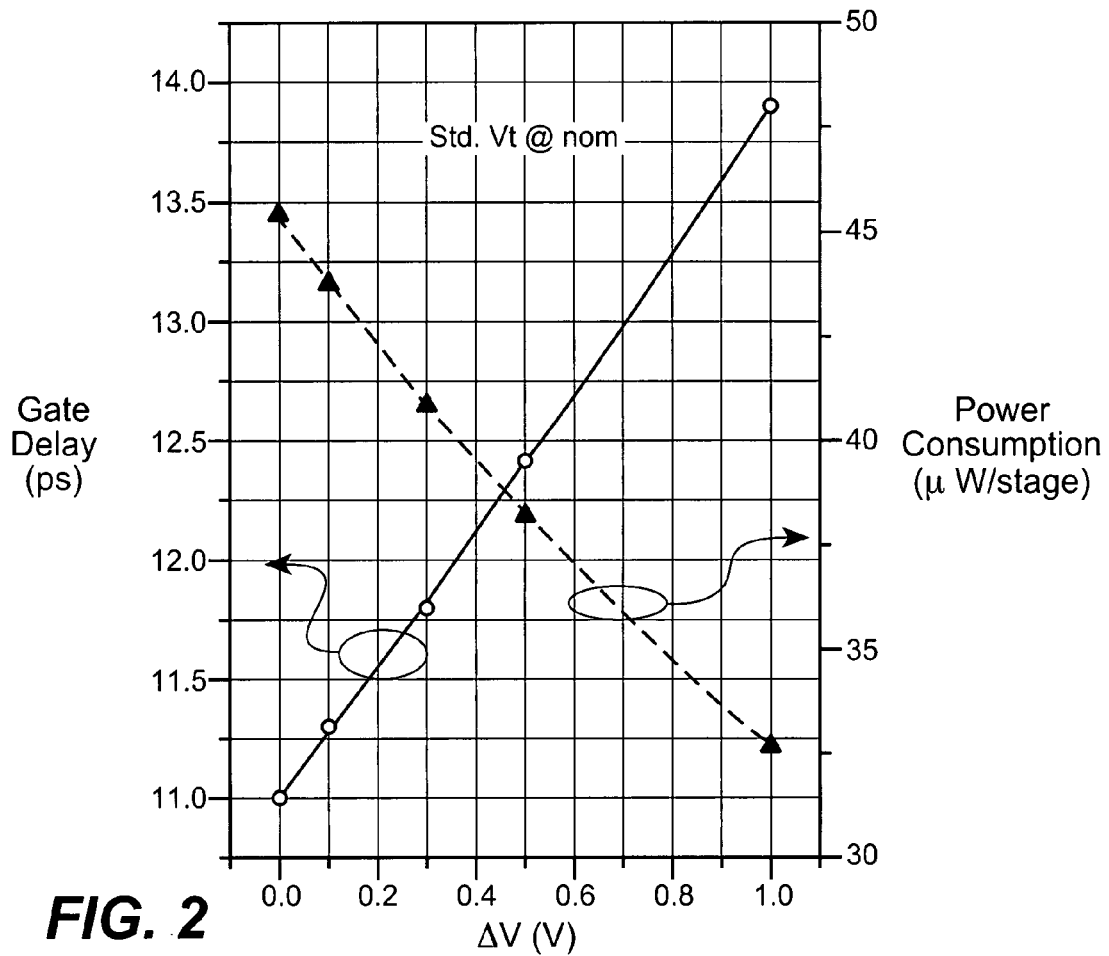
FIG. 2 is a graph which shows the gate delay increasing with the substrate bias, and power consumption decreasing with the substrate bias.

FIG. 2 is a graph based on a simulation result. Specifically, FIG. 2 illustrates gate density and power consumption of a ring oscillator as a function of substrate bias. Gate delay is plotted using dots in the grid, and is to be read using the vertical axis on the left side. The gate delay values indicated on the left side are in picoseconds. Power consumption is plotted using triangles in the grid, and is to be read using the vertical axis on the right side. The power consumption values indicated on the right side are in micro Watts per stage. The substrate bias ($\Delta V$) associated with the gate delay and power consumption, respectively, is to be read using the bottom horizontal axis. The substrate bias ($\Delta V$) values are indicated in Volts. Reading the graph shown in FIG. 2, one can see that gate delay increases with the substrate bias ($\Delta V$). In contrast, power consumption decreases with the substrate bias ($\Delta V$).

Figure 3:
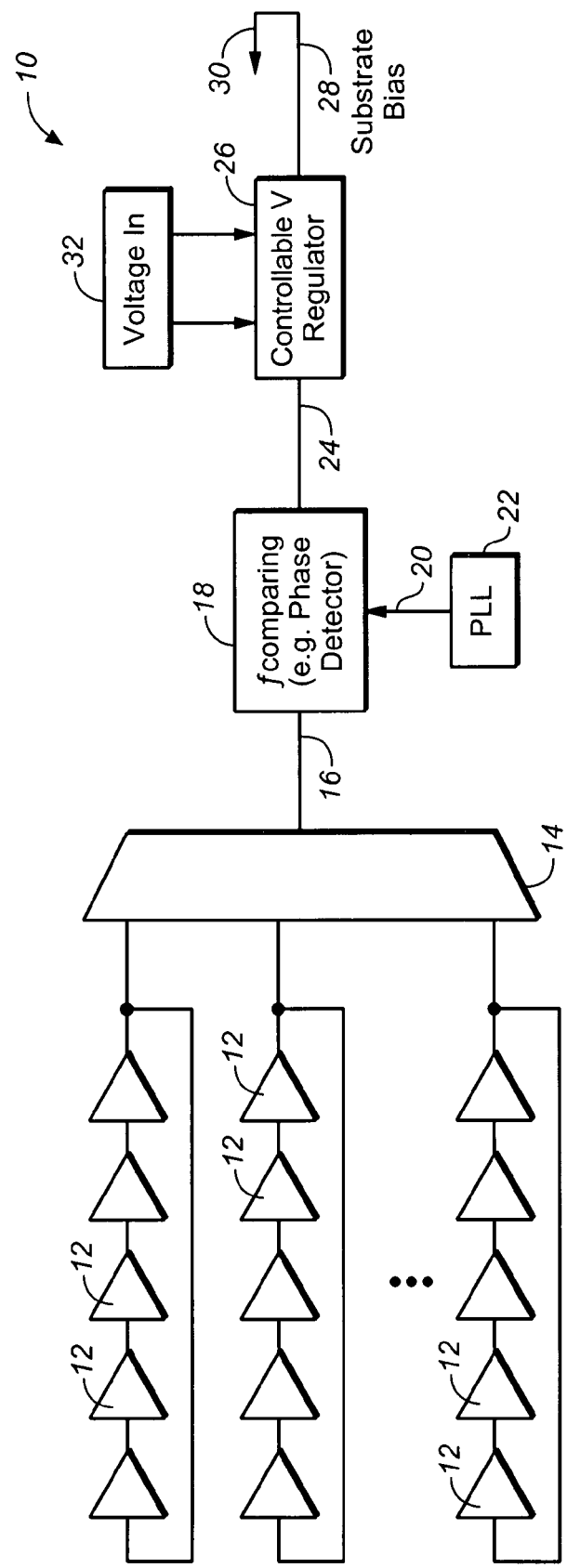
FIG. 3 is an illustration of an on-chip process control feedback loop which is in accordance with an embodiment of the present invention.

FIG. 3 is an illustration of an on-chip process control feedback loop which is in accordance with an embodiment of the present invention. Specifically, FIG. 3 illustrates an on-chip substrate voltage controller 10 which includes means for measuring the impact of process variation supply voltage variation and temperature deviation on circuit performance and means for applying an appropriate substrate bias to adjust chip performance and power consumption.

The controller 10 includes a plurality of interconnected loaded ring oscillators 12, arranged in a plurality of chains, placed in key places inside a chip. The plurality of chains of interconnected loaded ring oscillators 12 are connected to a multiplexer 14. An output 16 of the multiplexer 14 is connected to a comparator 18, such as a phase detector, and the multiplexer and comparator are configured to average outputs from all of the chains. The comparator 18 also receives an output 20 from a PLL 22 (i.e., a PLL controlled standard frequency, which does not fluctuate with the process variation), and is configured to compare the output 16 of the multiplexer 14 to the output 20 of the PLL 22. An output 24 of the comparator 18 is connected to a controllable voltage regulator 26 which applies an appropriate substrate bias 28 to adjust chip performance and power consumption (the feedback loop being represented in FIG. 3 with arrow 30). Specifically, the controllable voltage regulator 26 receives a voltage in 32 as well as the output 24 of the comparator 18, and is configured to apply the substrate bias 28 (based on the voltage in 32) depending on what is received from the comparator 18.

As such, the present invention provides an on-chip PVT variation monitor with on-chip substrate bias controller which form a feedback loop to automatically compensate the performance fluctuation caused by process variation. The method handles the performance variation issue together with the power consumption variation issue, therefore addressing one of the most important problems in deep sub-micron chip making.

While an embodiment of the present invention is shown and described, it is envisioned that those skilled in the art may devise various modifications of the present invention without departing from the spirit and scope of the appended claims.

What is claimed is:

1. An on-chip substrate voltage controller comprising means for measuring impact of process variation supply voltage variation and temperature deviation on circuit performance and means for applying an appropriate substrate bias to adjust chip performance and power consumption, wherein said means for measuring impact of process variation supply voltage variation and temperature deviation on circuit performance comprises a multiplexer and at least three separate unconnected chains of interconnected loaded ring oscillators connected to said multiplexer, wherein each chain is configured such that an output of said chain is both fed back to an input of said chain as well as provided as an input to said multiplexer, and only the output of each chain is provided as an input to said multiplexer, wherein said means for measuring impact of process variation supply voltage variation and temperature deviation on circuit performance further comprises a comparator, wherein an output of said multiplexer is connected to said comparator, wherein said comparator also receives an output from a PLL, wherein the comparator is configured to compare the output of said multiplexer to the output of said PLL, wherein said means for applying an appropriate substrate bias to adjust chip performance and power consumption comprises a controllable voltage regulator, wherein an output of said comparator is connected to said controllable voltage regulator, wherein said controllable voltage regulator receives a voltage in as well as the output of said comparator, wherein the voltage in is provided only to said controllable voltage regulator and not to said comparator, and wherein said controllable voltage regulator is configured to apply the substrate bias depending on what is received from said comparator.

2. An on-chip substrate voltage controller as recited in claim 1, wherein said comparator comprises a phase detector.

3. A method for adjusting chip performance and power consumption, said method comprising measuring impact of process variation supply voltage variation and temperature deviation on circuit performance and applying an appropriate substrate bias to adjust chip performance and power consumption, further comprising using at least three separate unconnected chains of interconnected loaded ring oscillators connected to a multiplexer to measure the impact of process variation supply voltage variation and temperature deviation on circuit performance, wherein each chain is configured such that an output of said chain is both fed back to an input of said chain as well as provided as an input to said multiplexer, and only the output of each chain is provided as an input to said multiplexer, further comprising using a comparator to measure the impact of process variation supply voltage variation and temperature deviation on circuit performance, wherein an output of said multiplexer is connected to said comparator, wherein the step of using a comparator comprises using a comparator which also receives an output from a PLL, wherein the comparator is configured to compare the output of said multiplexer to the output of said PLL, wherein the step of applying an appropriate substrate bias to adjust chip performance and power consumption comprises using a controllable voltage regulator, wherein the step of using a controllable voltage regulator comprises using a controllable voltage regulator which has an output of said comparator connected thereto, wherein the step of using a controllable voltage regulator comprises using a controllable voltage regulator which receives a voltage in as well as the output of said comparator, wherein the voltage in is provided only to said controllable voltage regulator and not to said comparator, and wherein said controllable voltage regulator is configured to apply the substrate bias depending on what is received from said comparator.

4. A method as recited in claim 3, wherein the step of using a comparator comprises using a phase detector to measure the impact of process variation supply voltage variation and temperature deviation on circuit performance.

* * * * *